(12) United States Patent
Hardtdegen et al.

(10) Patent No.: US 11,521,681 B2
(45) Date of Patent: Dec. 6, 2022

(54) COMPONENT HAVING OPTICALLY ACTIVE MATERIALS

(71) Applicant: Forschungszentrum Juelich GmbH, Juelich (DE)

(72) Inventors: Hilde Hardtdegen, Aachen (DE); Martin Mikulics, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 54 days.

(21) Appl. No.: 17/290,335

(22) PCT Filed: Nov. 6, 2019

(86) PCT No.: PCT/DE2019/000292
§ 371 (c)(1),
(2) Date: Apr. 30, 2021

(87) PCT Pub. No.: WO2020/114532
PCT Pub. Date: Jun. 11, 2020

(65) Prior Publication Data
US 2021/0383866 A1 Dec. 9, 2021

(30) Foreign Application Priority Data
Dec. 4, 2018 (DE) ...................... 10 2018 009 447.3

(51) Int. Cl.
*G11C 13/06* (2006.01)

(52) U.S. Cl.
CPC ..................... *G11C 13/06* (2013.01)

(58) Field of Classification Search
CPC ..... G11C 13/06; G11C 13/042; G11C 13/043; G11C 13/044; G11C 13/047; G11C 13/048
See application file for complete search history.

(56) References Cited

U.S. PATENT DOCUMENTS 3,518,634 A 6/1970 Ballman et al.
3,912,391 A 10/1975 Fleisher et al.
(Continued)

FOREIGN PATENT DOCUMENTS

DE 102004041893 A1 3/2006
WO WO 9748009 A1 12/1997

OTHER PUBLICATIONS

Matthias Wuttig, et al., "Phase-change materials for rewriteable data storage", Nature Materials, Nov. 2007, pp. 824-832, vol. 6, Nature Publishing Group, London, United Kingdom.
(Continued)

*Primary Examiner* — Tuan T Nguyen
(74) *Attorney, Agent, or Firm* — Leydig, Voit & Mayer, Ltd.

(57) ABSTRACT

A component includes a memory region containing optically active material, a control arrangement configured to provide at least one control signal configured to change optical properties of the optically active material, and a detector configured to detect a change in the optical properties of the optically active material. The detector includes an evaluation input region configured to receive at least one evaluation input signal and an evaluation output region configured to provide an evaluation output signal. The memory region is arranged between the evaluation input region and the evaluation output region, and the control arrangement adjoins the memory region.

26 Claims, 16 Drawing Sheets

(56) References Cited

U.S. PATENT DOCUMENTS

| | | |
|---|---|---|
| 5,051,950 A | 9/1991 | Evans, Jr. et al. |
| 6,483,735 B1 | 11/2002 | Rentzepis |
| 2006/0046379 A1 | 3/2006 | Symanczyk et al. |
| 2007/0195611 A1 | 8/2007 | Symanczyk et al. |
| 2018/0059440 A1* | 3/2018 | Yu .......................... G11C 11/56 |
| 2018/0261288 A1* | 9/2018 | Frumkin ............ G02B 6/12004 |

OTHER PUBLICATIONS

N. Vieweg, et al., "Terahertz Investigation of Liquid Crystals from the CB Family", 2010 IEEE Photonics Society Winter Topicals Meetings Series (WTM), Dec. 2010, pp. 32-33, IEEE, New York, USA.

R. Rey-De-Castro, et al., "Subpicosecond Faraday effect in $Cd_{1-x}Mn_xTe$ and its application in magneto-optical sampling", Applied Physics Letters, Oct. 25, 2004, pp. 3806-3808, vol. 85, No. 17, American Institute of Physics, Maryland, USA.

* cited by examiner

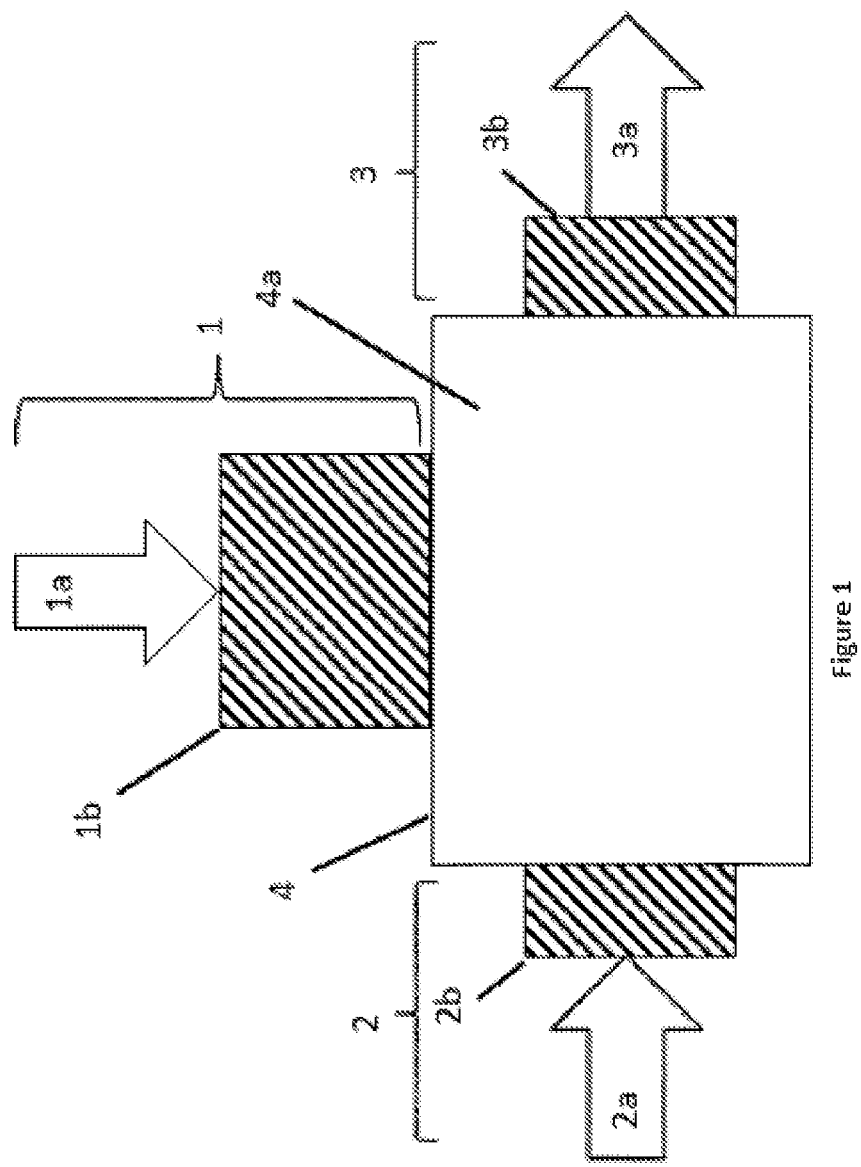

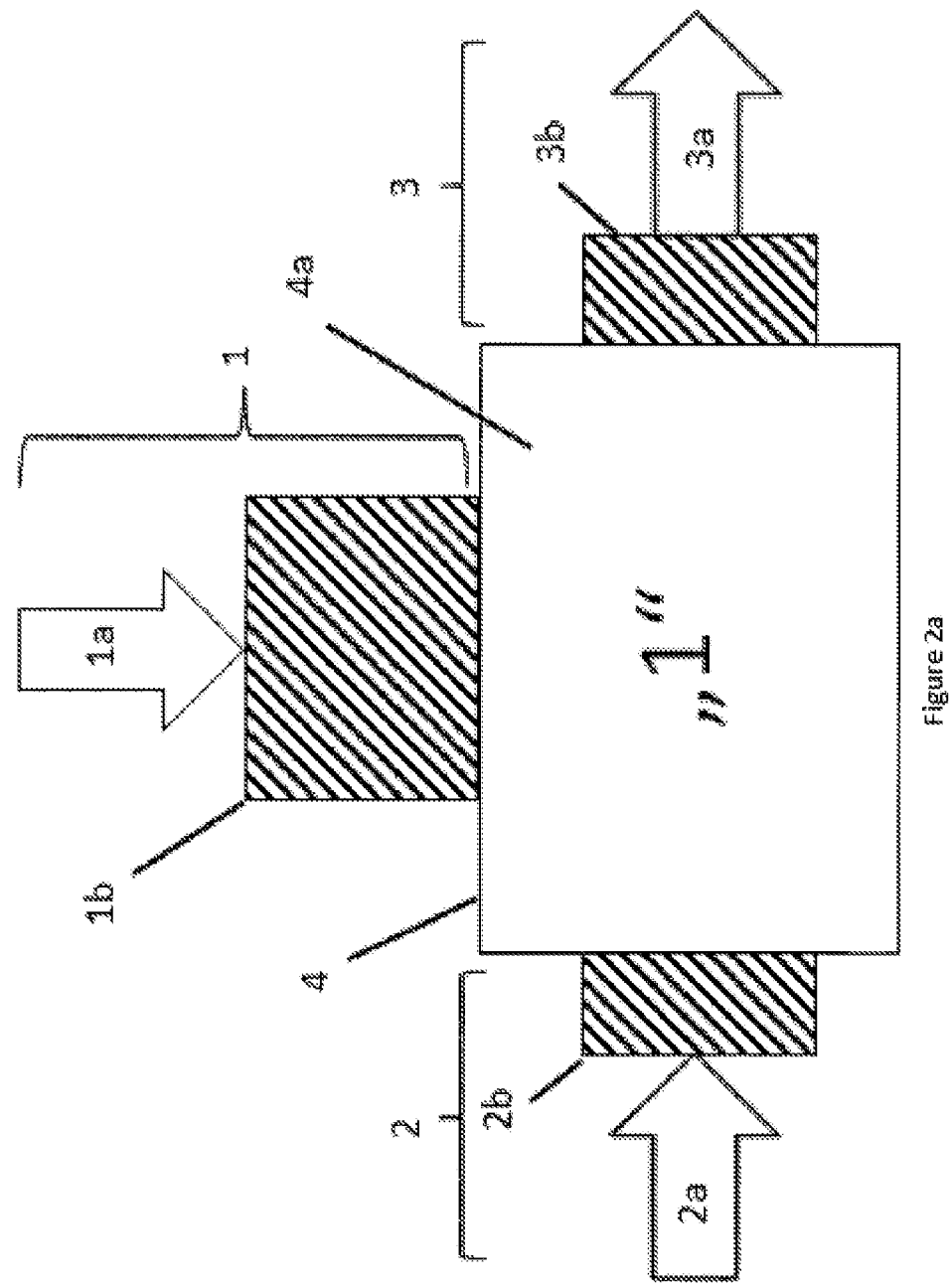

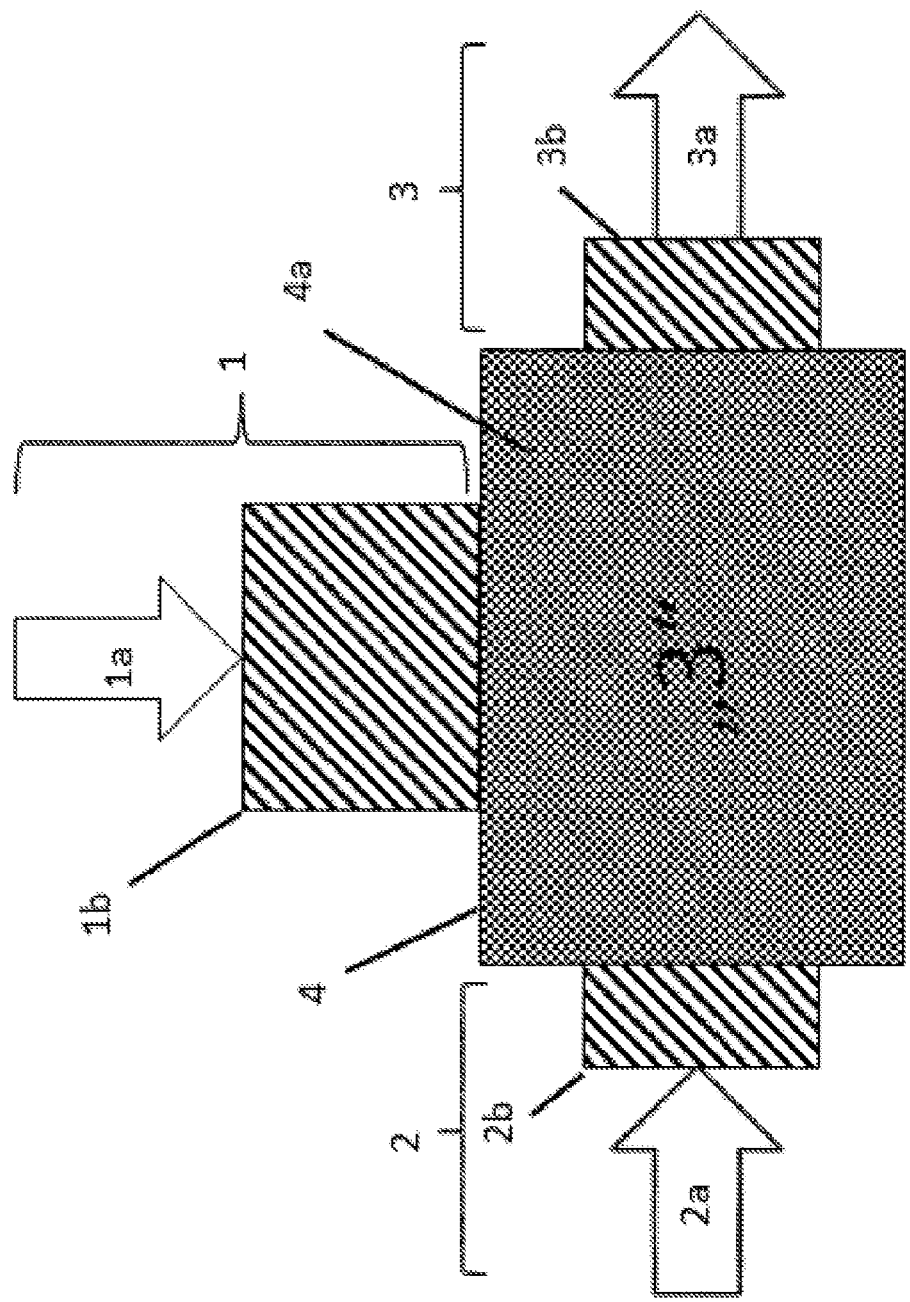

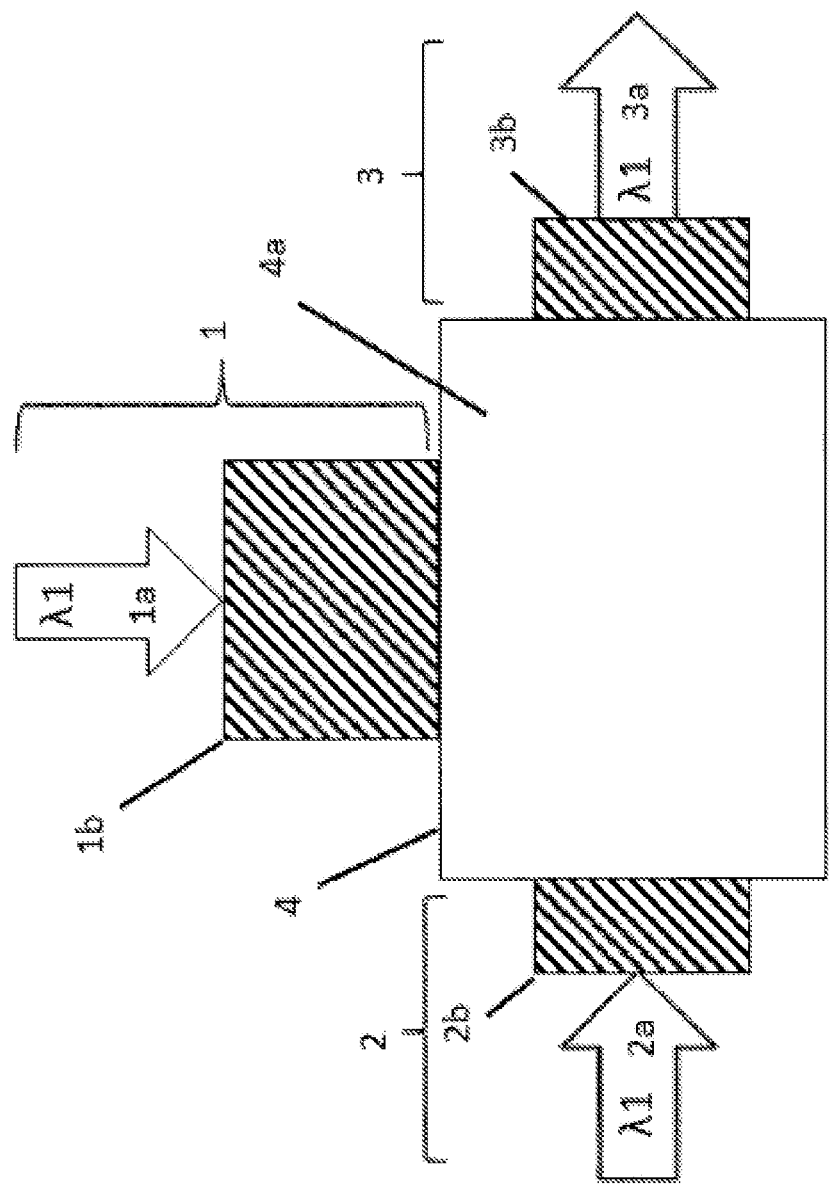

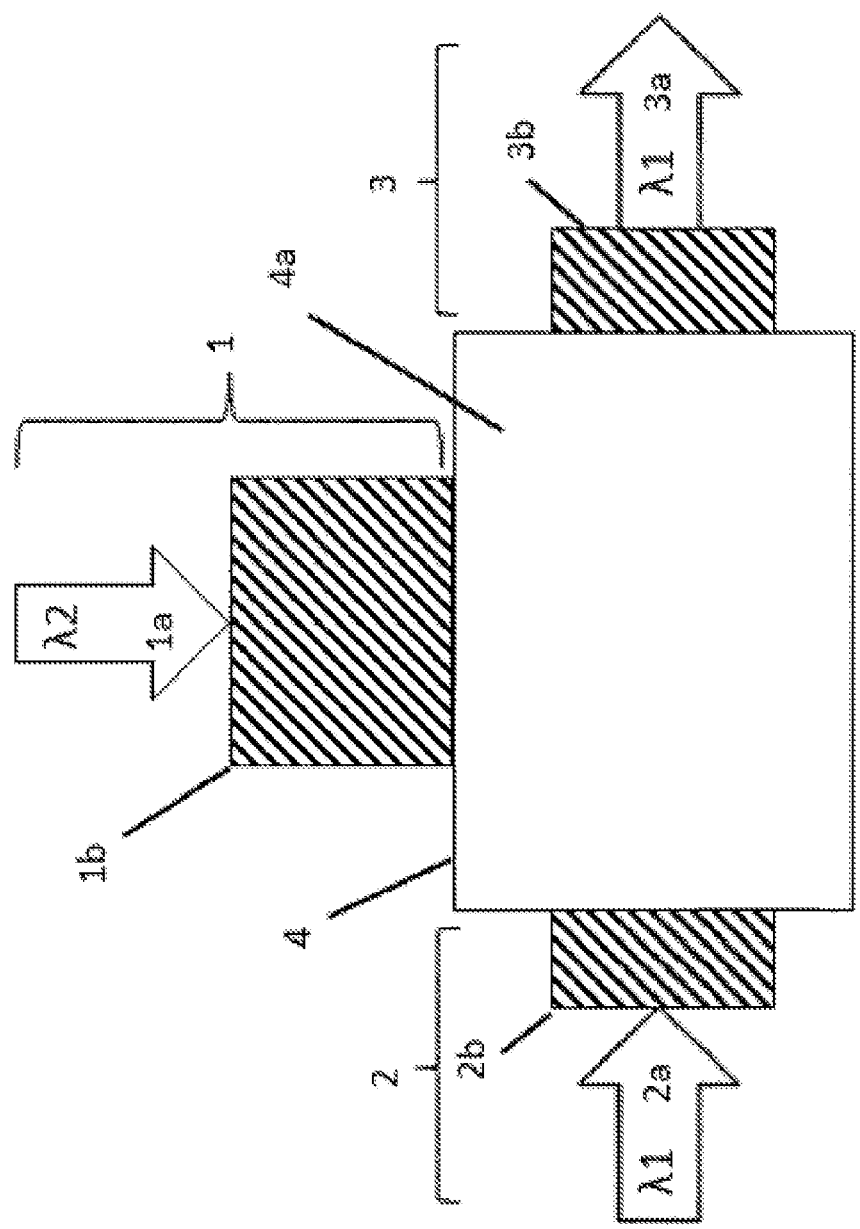

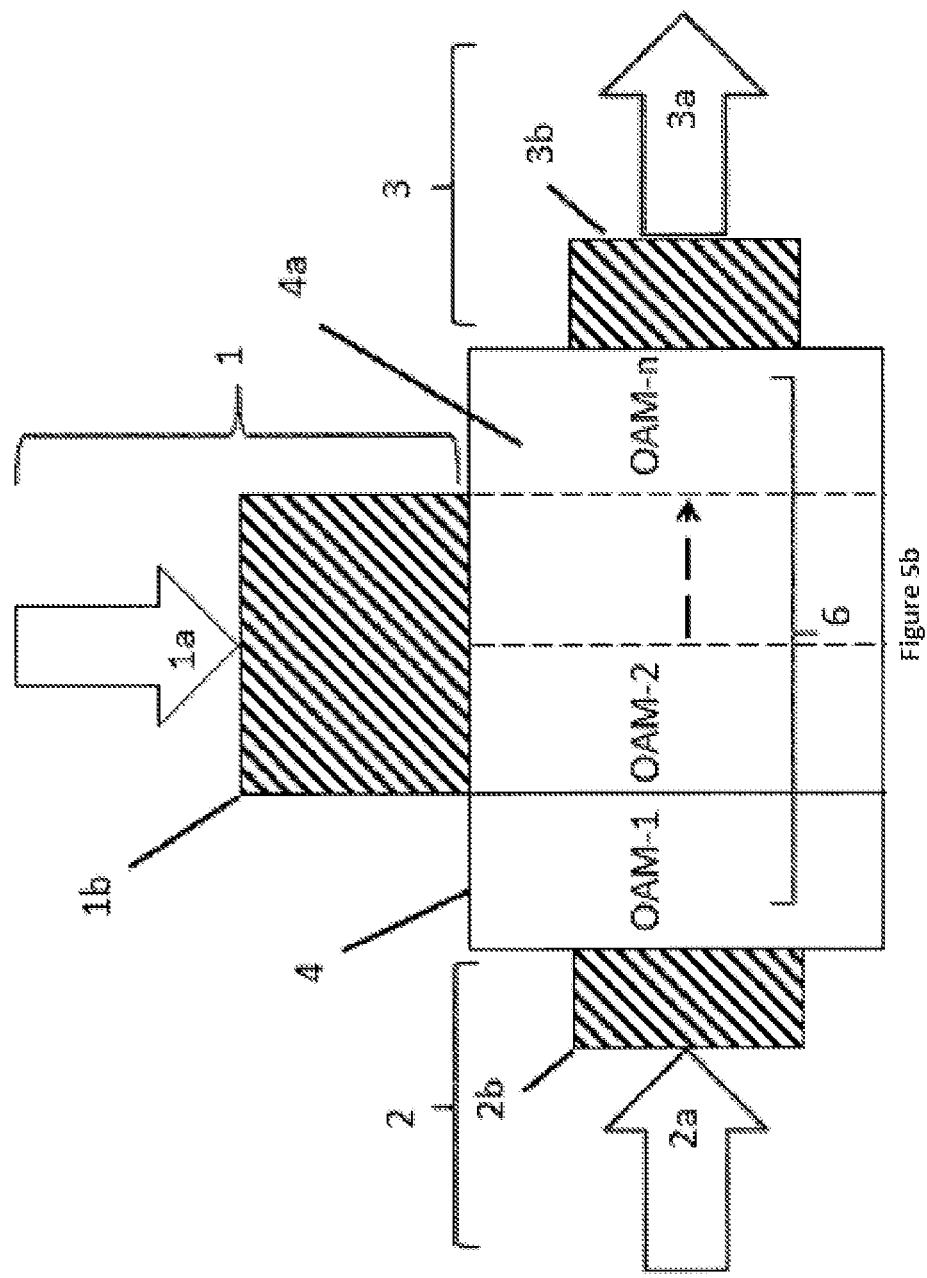

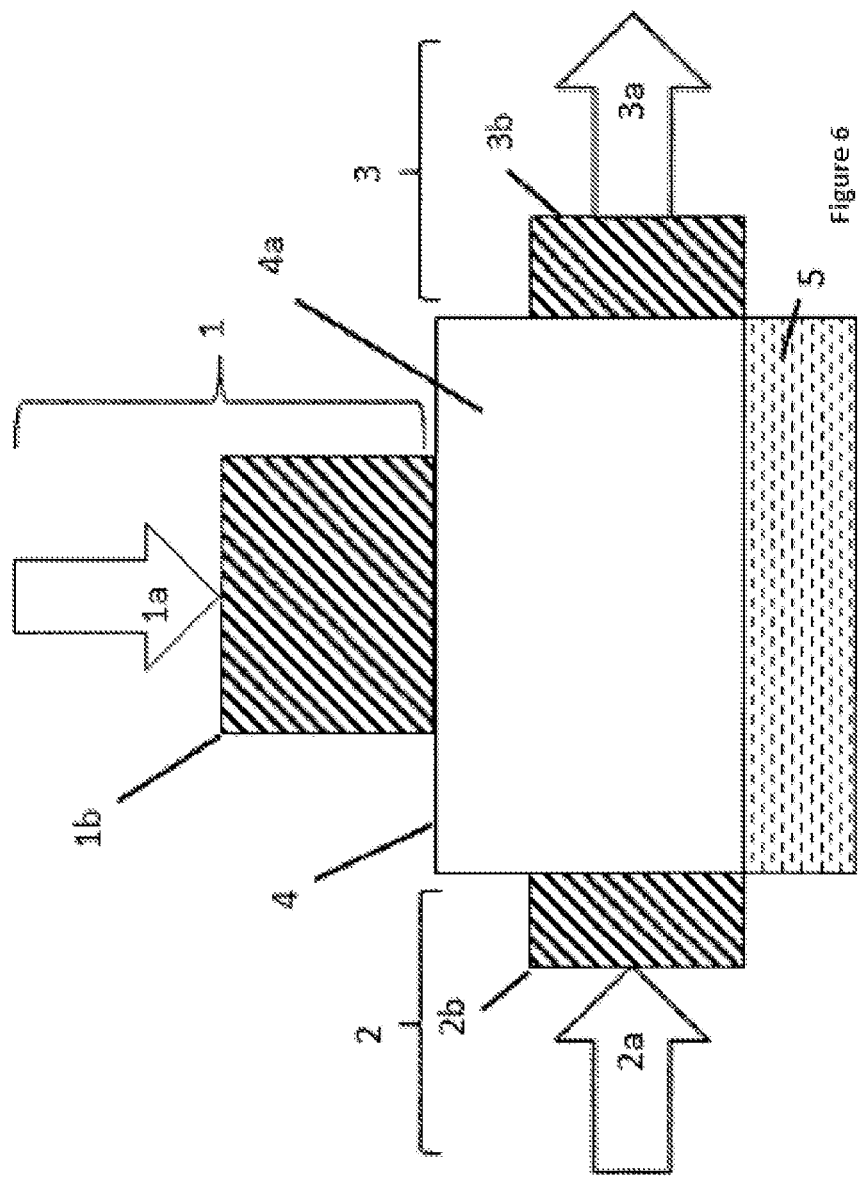

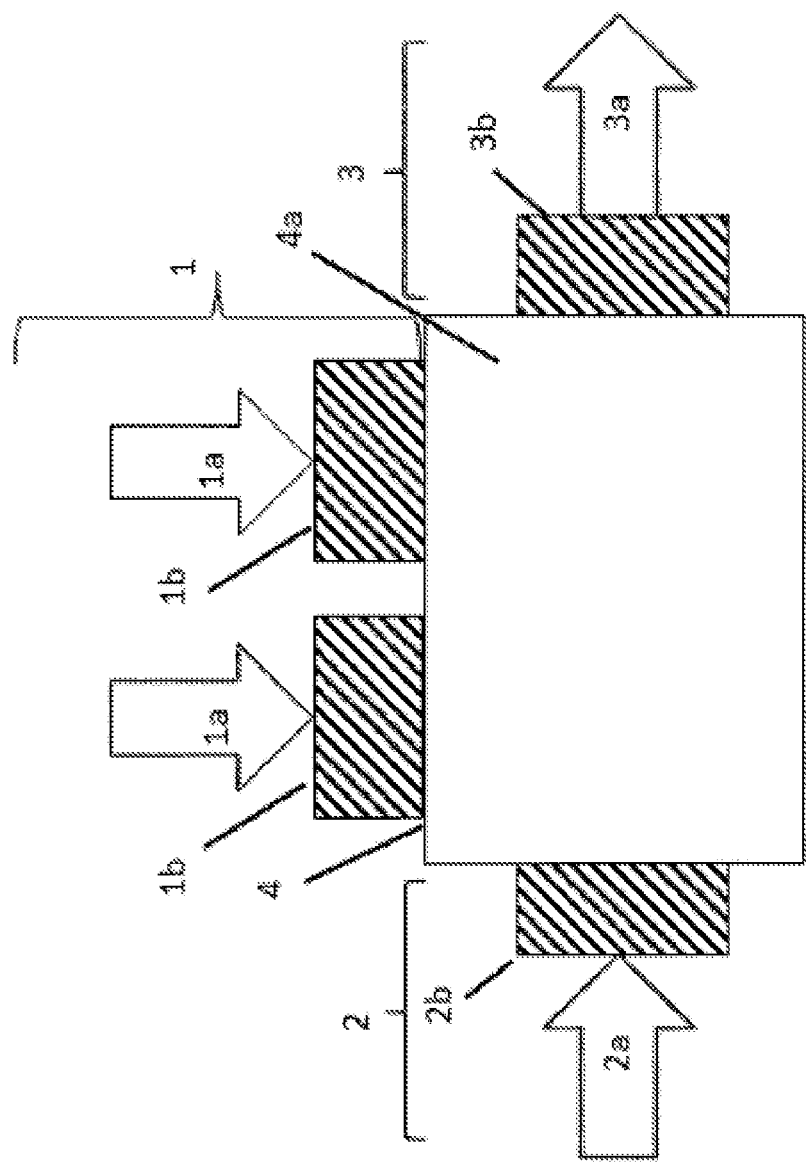

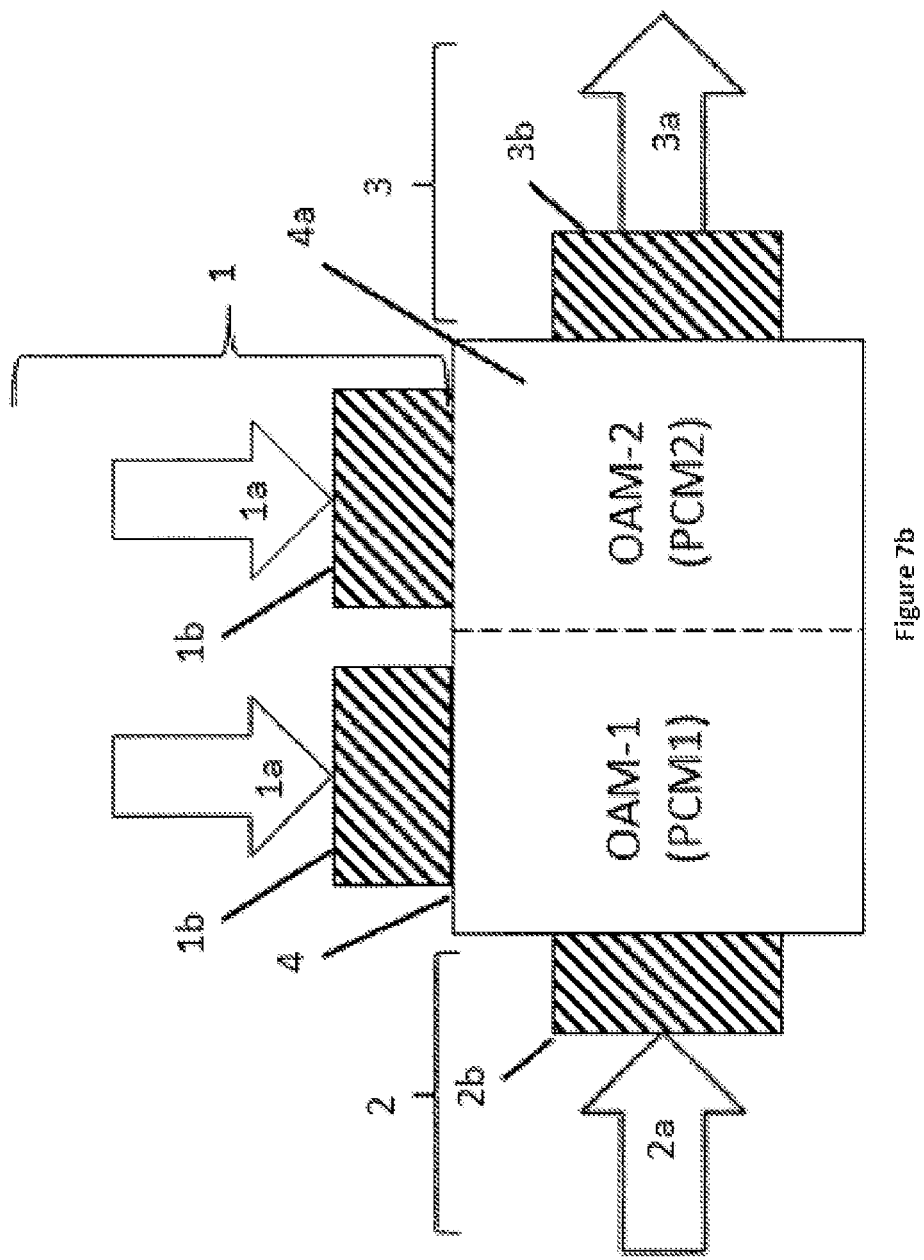

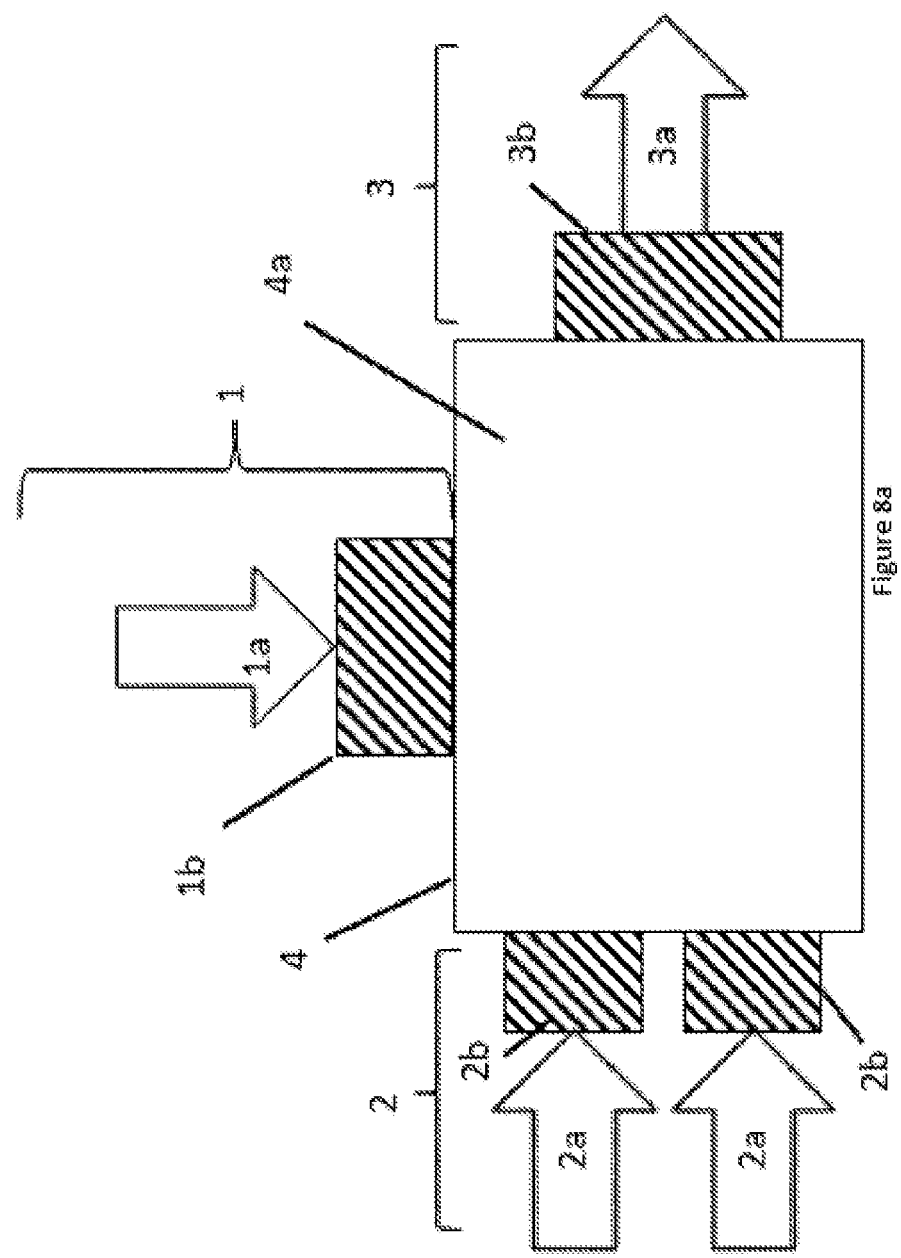

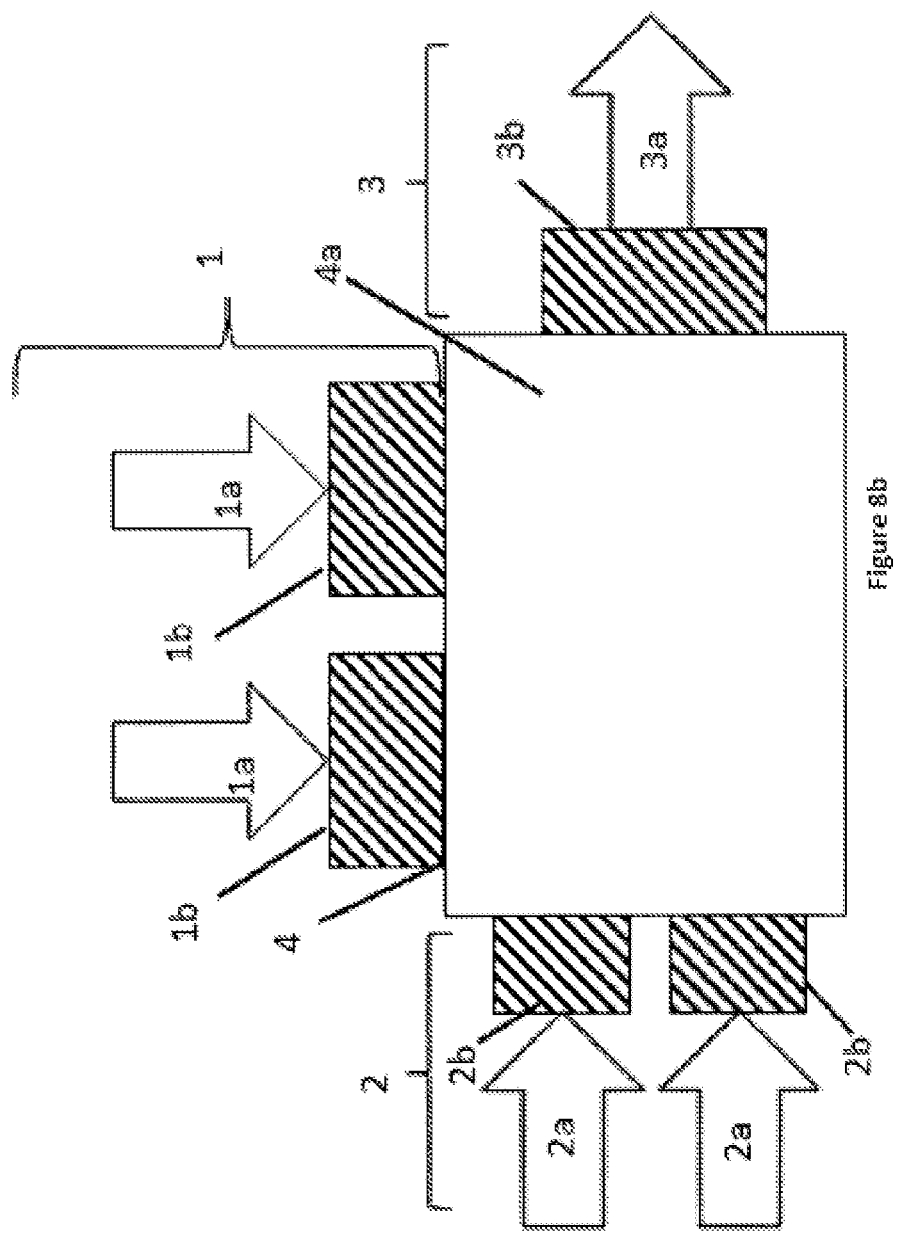

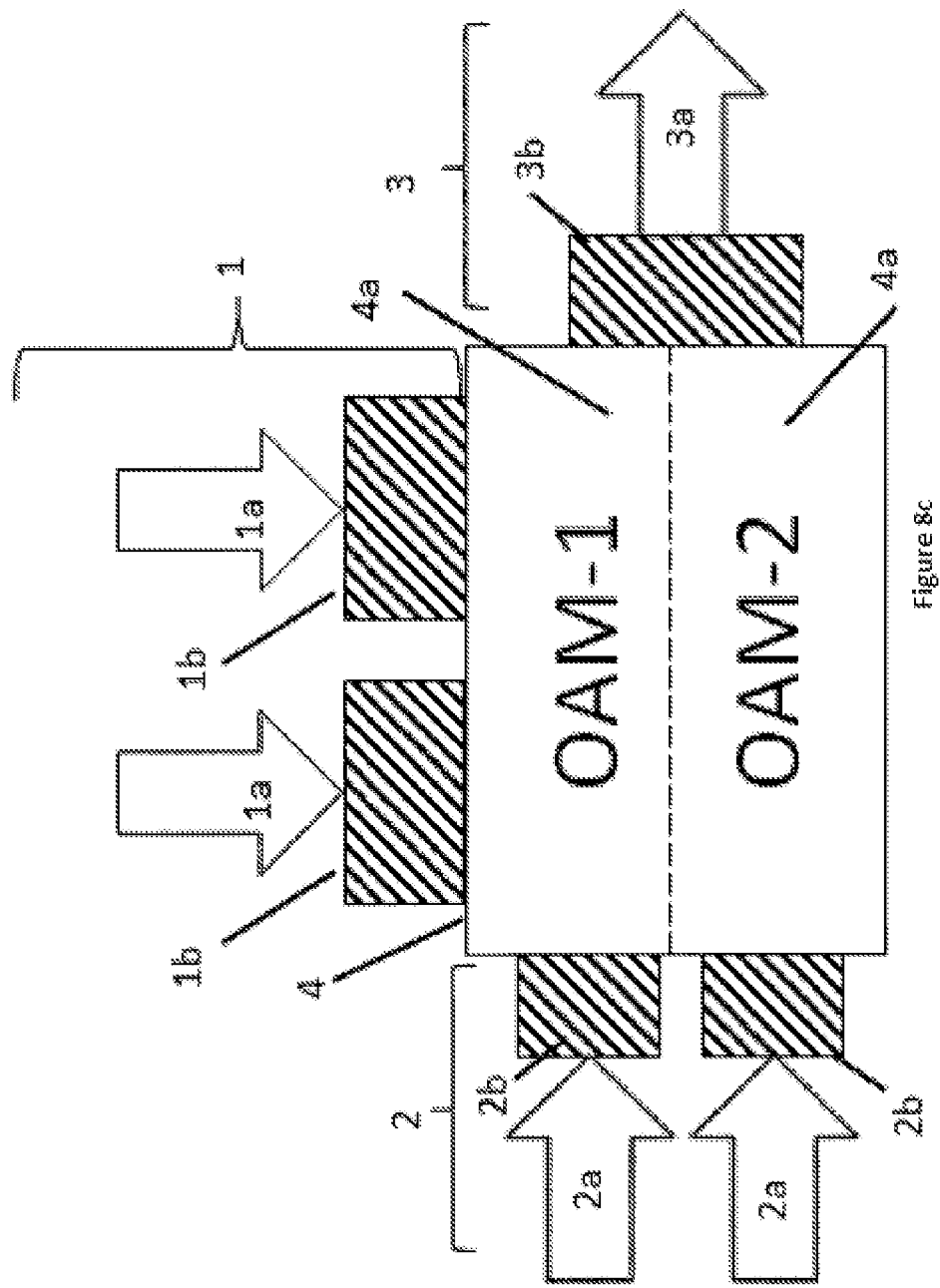

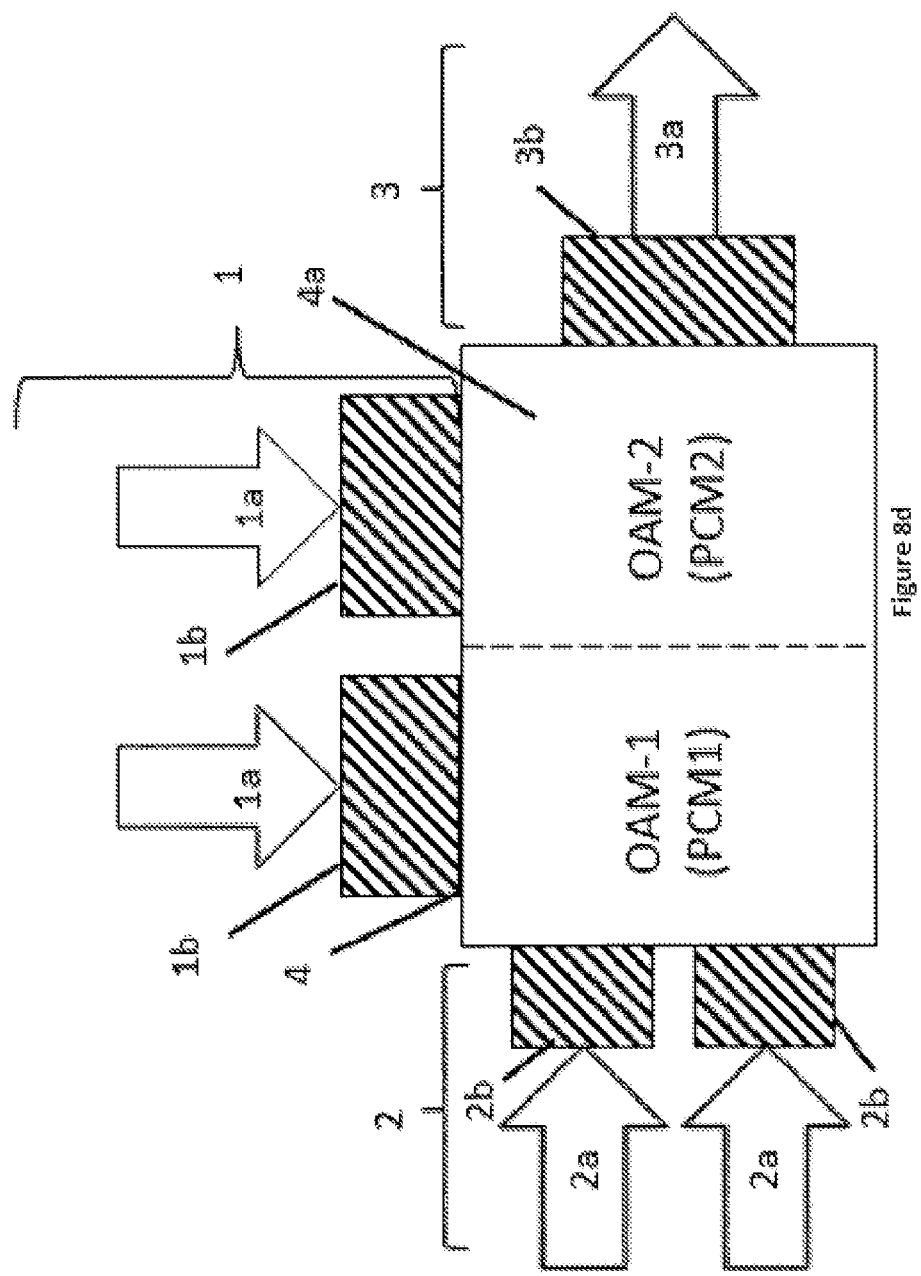

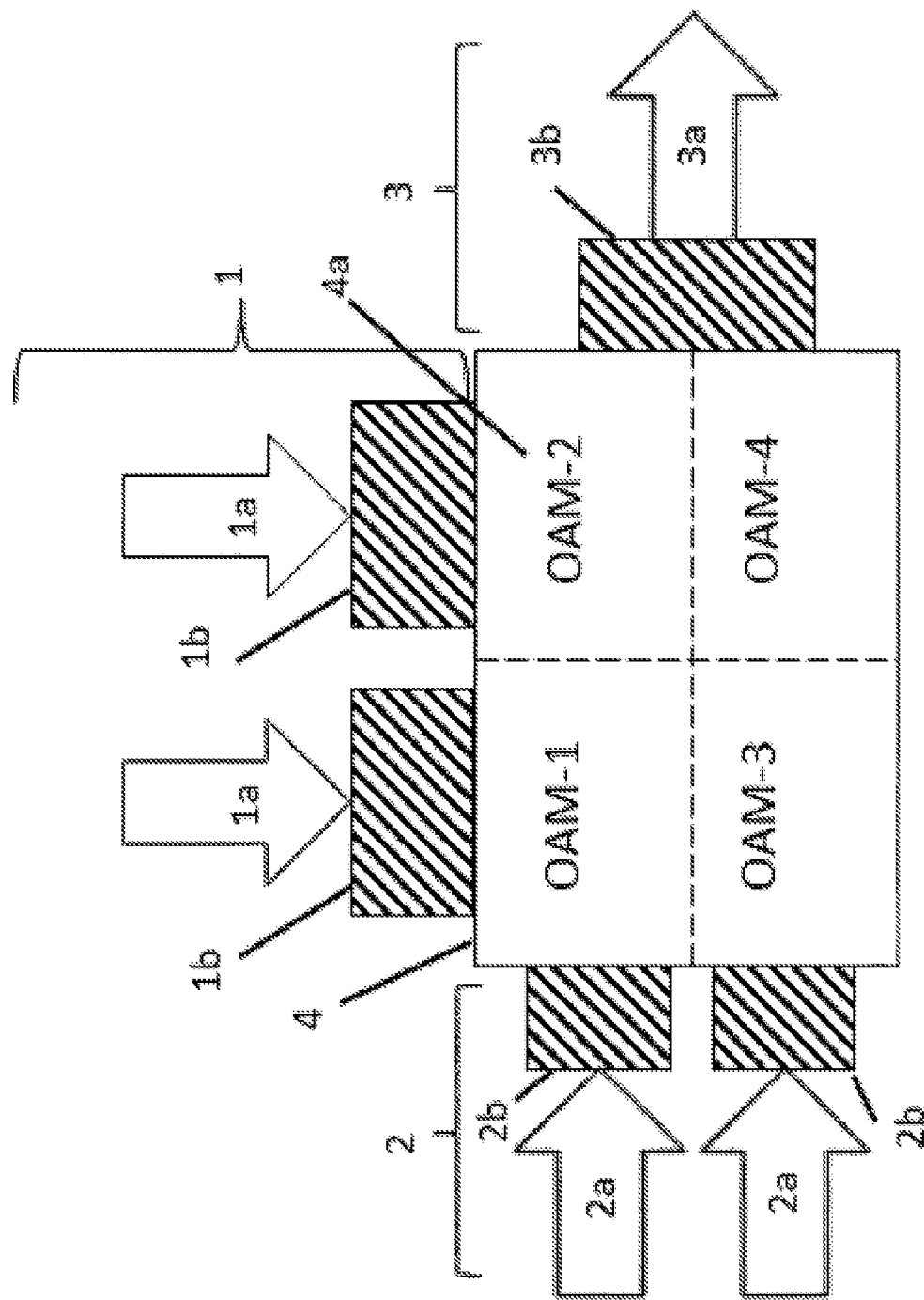

COMPONENT HAVING OPTICALLY ACTIVE MATERIALS

CROSS-REFERENCE TO PRIOR APPLICATIONS

This application is a U.S. National Phase Application under 35 U.S.C. § 371 of International Application No. PCT/DE2019/000292, filed on Nov. 6, 2019, and claims benefit to German Patent Application No. DE 10 2018 009 447.3, filed on Dec. 4, 2018. The International Application was published in German on Jun. 11, 2020, as WO 2020/114532 A1 under PCT Article 21(2).

FIELD

The present disclosure relates to a component comprising optically active materials and to a method for processing and/or storing information using said component.

BACKGROUND

Conventional electronic components for processing and/or storing information, such as transistors, logic circuits or processors, are based predominantly on transporting and controlling charge carriers. An example of a known transistor is the field-effect transistor. It has three connections:

Source
Gate—of the control electrode
Drain

Field-effect transistors are controlled by a voltage. The current flow between drain and source is controlled or amplified by selectively increasing and reducing conductive and non-conductive regions of the semiconductor material.

The semiconductor material, which is p-doped and n-doped in advance, is either depleted or enriched with charge carriers by the applied voltage or the electric field produced thereby. (Wikipedia: de.wikipedia.org/wiki/Feldeffekttransistor; as at: Dec. 18, 2017, at 2:43 p.m.)

The components known previously from the prior art predominantly use physically technical material solutions which are based on the transport of charge carriers. Such components are generally known to generate heat during operation. Frequently, the disadvantage here is that degradation of the properties arises, which leads to inefficiency of the components and to losses.

Also known from the prior art are memory components with memory cells based on an active material layer which can be changed in its phase state (PCRAMs) and in which the active material changes its phase state from an amorphous to a crystalline state by means of an electrical current pulse. In this type of memory cell (DE 10 2004 041 893 A1), the phase state (amorphous or crystalline) of a chalcogenide-containing material (typically Ge—Sb—Te or Ag—In—Sb—Te compounds) is used to store a data bit. For reading the information, use is made of the fact that the amorphous and the crystalline phase of said compounds clearly differ in their electrical conductivity. The programming of a cell in the amorphous state (high impedance) into the crystalline phase (low impedance) takes place in that an electrical current pulse heats the material to above the crystallization temperature by means of Joule heat and thereby (partially) crystallizes the material. The memory cell is reset or erased in that the material is heated by means of a second current pulse to above the melting temperature which is higher than the crystallization temperature, and converted into the amorphous state by rapid cooling. A disadvantage of these memory components is that high current densities or heat quantities are necessary for both the write operation and for the erase operation.

SUMMARY

In an embodiment, the present invention provides a component including a memory region containing optically active material, a control arrangement configured to provide at least one control signal configured to change optical properties of the optically active material, and a detector configured to detect a change in the optical properties of the optically active material. The detector includes an evaluation input region configured to receive at least one evaluation input signal and an evaluation output region configured to provide an evaluation output signal. The memory region is arranged between the evaluation input region and the evaluation output region, and the control arrangement adjoins the memory region.

BRIEF DESCRIPTION OF THE DRAWINGS

Subject matter of the present disclosure will be described in even greater detail below based on the exemplary figures. The invention defined by the following claims is not limited to the exemplary embodiments. All features described and/or illustrated herein can be used alone or combined in different combinations. The features and advantages of various embodiments will become apparent by reading the following detailed description with reference to the attached drawings, which illustrate the following:

FIG. 1 illustrates an exemplary embodiment of a component according to an embodiment;

FIG. 2a illustrates an exemplary embodiment of a component comprising a phase-change material (PCM) as an optically active means in state "1;"

FIG. 2c illustrates an exemplary embodiment of a component comprising a phase-change material (PCM) as an optically active means in state "3;"

FIG. 3 illustrates an exemplary embodiment of a component controlled and evaluated by the optical influence of photons of the same wavelength;

FIG. 4 illustrates an exemplary embodiment of a component controlled and evaluated by the optical influence of photons of different wavelengths;

FIG. 5b illustrates an exemplary embodiment of a component with a layer arrangement/layer structure of different optical materials oriented in parallel to the beam direction of the control arrangement;

FIG. 6 illustrates an exemplary embodiment of a component with a means which reflects the control signal;

FIG. 7a illustrates an exemplary embodiment of a component with two control signals and two signal transmitters of the control arrangement and an optically active material;

FIG. 7b illustrates an exemplary embodiment of a component with two control signals and two signal transmitters of the control arrangement and two different optically active materials;

FIG. 8a illustrates an exemplary embodiment of a component with two evaluation input signals and two signal transmitters in the evaluation input region;

FIG. 8b illustrates an exemplary embodiment of a component with two control signals and two signal transmitters of the control arrangement and two evaluation input signals and two signal transmitters in the evaluation input region;

FIG. 8c illustrates an exemplary embodiment of a component with two control signals and two signal transmitters of the control arrangement and two evaluation input signals and two signal transmitters in the evaluation input region and a layer arrangement/layer structure comprising two different optically active materials, the layers of which are each oriented perpendicularly to the beam direction of the control arrangement;

FIG. 8d illustrates an exemplary embodiment of a component with two control signals and two signal transmitters of the control arrangement and two evaluation input signals and two signal transmitters in the evaluation input region and a layer arrangement/layer structure comprising two different optically active materials, the layers of which are each oriented in parallel to the beam direction of the control arrangement; and FIG. 8e illustrates an exemplary embodiment of a component with two control signals and two signal transmitters of the control arrangement and two evaluation input signals and two signal transmitters in the evaluation input region and a layer arrangement/layer structure comprising four different optically active materials.

DETAILED DESCRIPTION

Figure 2B:
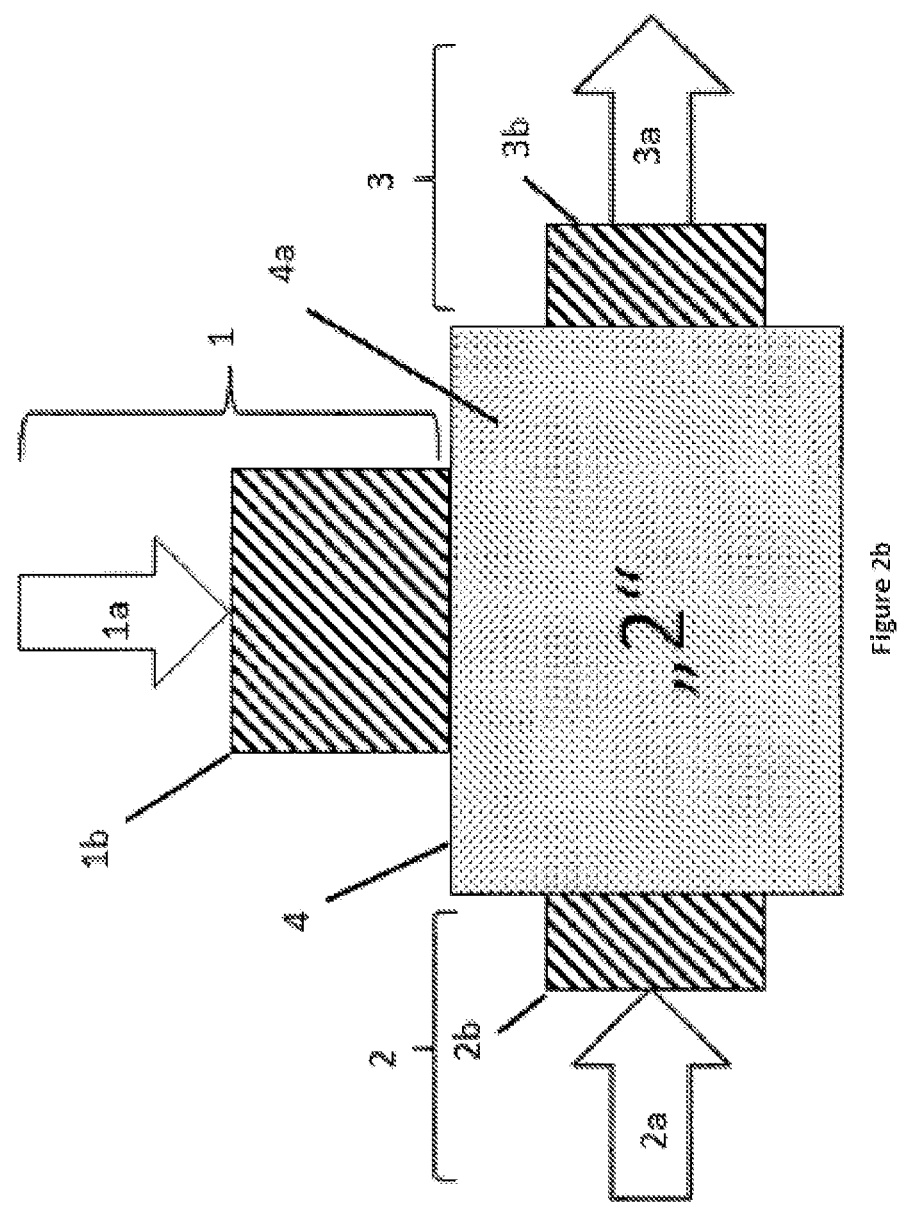
FIG. 2b illustrates an exemplary embodiment of a component comprising a phase-change material (PCM) as an optically active means in state "2;"

The present disclosure describes a component which enables improved, faster and more energy-saving processing and/or storing of information in comparison to conventional components. The present disclosure further describes a method for processing and/or storing information in which said component is used.

A component according to the present disclosure is based on the finding that the initial optical properties of certain materials are changed by external influence, namely thermal influence (for example by phonons) and/or optical influence of photons or by the influence of an input power in the form of optical, electrical, evanescent and/or magnetic fields or by mechanical influence. This property can advantageously be used for the processing, storing and reading of information.

Therefore, within the scope of the present disclosure, a component has been developed which comprises, as a carrier of information, at least one optically active material having optically detectable properties which can be changed by external influence.

In the context of the present disclosure, optically active materials are understood to mean materials which, due to external influence in the form of, for example, thermal influence or optical influence, for example by phonons and/or photons, or by the influence of an input power in the form of optical, electrical, evanescent and/or magnetic fields or also by mechanical influence, can be changed in their optical (output) properties in such a way that they react by changing their optically detectable properties, in particular by changing their transmission property and/or reflection property. These changes caused by the external influence can, for example, be accompanied by a change in the structure, in particular, for example, by a change in the configuration of the molecules and atoms of the optically active material relative to one another, a change in the composition of the material, the atomic environment and/or a change in the oxidation state of the material, wherein said changes are preferably reversible, with or without external influence.

The optically active materials can be present both as a solid, gas and/or liquid. They can be both organic and/or inorganic.

Suitable optically active materials are, for example, materials which are photochromic, electrochromic, magnetochromic and/or piezochromic.

As materials which can preferably be changed by optical influence, for example by the influence of a minimal energy in the form of a single photon, the following compounds can be mentioned by way of example but not limited thereto: azo compounds, stilbines, azastilbines, spiropyrans, spirooxazines, triarylmethanes, polymethines, pyrroles, hydrazines, sydnones, disulfides, nitroso dimers and quinones. Chalcogenide-based phase-change compounds: such as in the GeTe—$Sb_2Te_3$ material system, Te—Ge—Sb—S material system, Ag—In—Sb—Te material system as well as the phase-change materials Sb(Bi,Au,As), Ge—Sb—Mn—Sn, Ge(In, Ag, Sn)[1]; oxides of titanium, tungsten, sulfides of the alkaline earth metals, and halides of silver and zinc.

The optical influence, in particular by photons, can subsequently also induce a thermal influence in that, for example, the photons, in particular for example in a signal transmitter, are converted into phonons, in particular heat, and this heat brings about the change in the optical properties of the optically active material.

As materials which can preferably be changed by electrical influence, the following compounds can be mentioned by way of example but not limited thereto: oxides of tungsten, iridium, molybdenum, nickel, vanadium, cerium, chromium, cobalt, copper, iron, manganese, niobium, palladium, praseodymium, rhodium, ruthenium, conjugated conductive polymers, metal polymers, i.e., materials with two or more redox states and with unique electronic absorption spectra; chalcogenide-based phase-change compounds: e.g., in the GeTe—$Sb_2Te_3$ material system, and in the Ag—In—Sb—Te material system; materials which exhibit the electro-optical Kerr effect and/or which change the optical properties by the influence of an electric field. Materials used in nonlinear optics and/or which are birefringent: DAST crystals (http://www.rainbowphotonics.com/prod_dast.php) liquid crystals [2], electro-optical crystals, such as $LiNbO_3$ and $LiTaO_3$; Ge—Sb—Mn—Sn, Ge(In, Ag, Sn).

As materials which can preferably be changed by magnetic or magneto-optical influence, the following compounds can be mentioned by way of example but not limited thereto: colloidally dissolved magnetic nanoparticles, such as $Fe_3O_4$, materials exhibiting the magneto-optical Kerr effect (MOKE), such as dilute magnetic semiconductors, such as CdMnTe [3].

As materials which can preferably be changed by mechanical influence (used in the field of voltage optics), the following compounds can be mentioned by way of example but not limited thereto: mechanochromic and specifically piezochromic materials, such as polyvinyl chloride, fluorites.

In the context of the present disclosure, the term "transmission" is understood to mean the permeability of a material for electromagnetic waves (e.g., light). If an electromagnetic wave, which moves, for example, in medium A (e.g., air), impinges on material B of finite thickness, it is, depending on the material properties of material B (in particular, for example, the refractive index), partly reflected at the interfaces and absorbed completely or partially when passing through. The remaining residue is transmitted through material B and exits again, for example, on the opposite side of material B (Wikipedia). A measure for determining the transmission can be the transmittance T.

The transmittance T, a material property, is defined as the quotient between the wave intensity I behind and the intensity $I_0$ in front of the obstacle [https://de.wikipedia.org/wiki/Transmission_(Physik)#cite_note-1]:

$$T = \tau = \frac{I}{I_0}$$

The transmittance T is thus a measure of "passed-through" intensity and can assume values of between 0 and 1 or 100%, respectively.

In the context of the present disclosure, the term "reflection" is understood to mean the retroreflection of light at an interface at which the wave impedance or the refractive index of the propagation medium changes.

The measurement of transmission and reflection can be acquired separately. In the context of the present disclosure, however, the detection of the transmission preferably serves to enable improved, faster and more energy-saving processing and/or storing of information in comparison to conventional components. In an advantageous embodiment of the component, the reflection can be suppressed since it can lead to a loss in the efficiency of the component because of the associated losses of intensity.

For example, a thermal influence, for example in the form of laser irradiation, can produce an optically readable change in the transmission, in particular, for example, a change in the absorption coefficient and/or the refractive index of the optically active material. This change can then be read with the aid of a read operation with optical analysis units, e.g., as ones and zeros and/or intermediate states, which the material can assume. The optically active material as a memory element can thus, for example, be in position 1 and 0 and therefore contain bits of the information. The optically active material can thus replace the usual electrically controlled data memories. By means of an advantageous geometric and spatial arrangement of one and/or of a plurality of different layers of the optically active material in the component, a transmission of up to and including 100% can, for example, be set. In the case of an optical influence, e.g., also triggered by a photon source, such as a laser, there are anti-reflection layers which are appropriate to the selected wavelength of the laser and can be used to suppress reflection.

According to the present disclosure, the component, hereinafter also synonymously referred to as an element, comprises at least one memory region, also referred to synonymously as a functional region, containing optically active material, a control arrangement having at least one control signal for changing the optical properties of the optically active material by external influence, as well as means for detecting the change in the optical properties of the optically active material, comprising an evaluation input region having at least one evaluation input signal and an evaluation output region having at least one evaluation output signal, wherein the memory region or functional region is arranged between the evaluation input region and the evaluation output region and the control arrangement adjoins the memory region or functional region. The memory region or also the functional region serves, for example, for processing, storing, transmitting and/or relaying the information. In an advantageous embodiment of the component, the evaluation input region and the evaluation output region may comprise signal transmitters. The optically active material of the component can be changed in terms of its optical properties by external influence, for example, thermal, optical, electrical, magnetic or mechanical influence, of at least one means, in particular of a control signal of a control arrangement, such that an optically measurable change in the transmission property occurs. This change can preferably be measured with the aid of the transmittance which is changed in comparison to the initial state. This optically readable change can be detected and evaluated, for example, with the aid of photodetectors (photodiodes) and converted into an electrical signal, for example, via an interface.

The transmission property can be changed partially or completely. This is a function of the set parameters of the control arrangement. The change in transmission can be controlled, for example, via the parameters of the control arrangement. In the case of an optical influence, this can be controlled, for example, via the wavelength and the irradiated power $P_{in}$, the duration of the irradiated power/influence, the diameter of the laser beam, the number of control signals and the geometric arrangement of the control signals. The changes caused to the transmission properties are preferably reversible, with or without external influence. In a further possible embodiment of the component, in which the change in the optical properties of the optically active material is irreversible, this embodiment of the component can be used, for example, as a non-volatile memory.

The change in the optical properties of the optically active material by the control arrangement, with at least one control signal, can be triggered by all possible external influences listed in the context of the, wherein, however, for each specific element only one type of external influence is selected and exerted on the optically active material by the control arrangement in each case. Therefore, the at least one control signal always comprises only one type of external influence which acts on the memory region and leads to a change in the optical properties of the optically active material. In this case, this one type of external influence can be transmitted to the optically active material of the memory region by at least one control signal but also by a plurality of control signals. The control arrangement with means, in particular at least one control signal, for changing the optical properties of the optically active material can advantageously comprise at least one signal transmitter for transmitting the control signal or control signals, which for this purpose can comprise, for example, means for transporting the at least one control signal, wherein said control signals of a respective component can comprise in each case a form of external influence from the group of, for example, photons, phonons or in each case an input power in the form of optical, evanescent, magnetic or electrical fields or a mechanical influence, so that for a component only one of said forms of the external influence is selected in each case, i.e., only one type of external influence is selected for each component in each case.

In the case of the optical influence, this can, for example, be an optical conductor. The evaluation input region and the evaluation output region may each also have at least one signal transmitter. Said optical conductors of the control arrangement, of the evaluation input region and/or of the evaluation output region can, for example, comprise glass fibers, waveguides (on chip). However, in the case of an optical influence, it is also possible for the signal of the control arrangement triggering the change in transmission to be applied directly to the optically active material in the memory region, preferably with the aid of an optical aperture. This is preferably done in the near-field arrangement. However, direct irradiation of the evaluation input signal or direct evaluation of the evaluation output signal without signal transmitters can also take place in the evaluation input region and evaluation output region.

In general, it is possible for the component to have a control arrangement, an evaluation input region and/or an evaluation output region even without signal transmitters.

In the case of a mechanical influence, for example, with or without suitable signal transmitters of the control arrangement, a pressure or a tension can be applied to the optically active material.

The signal transmitters of the control arrangement can trigger the change in the optical properties of the optically active material by relaying and transmitting the at least one control signal, in the form of photons, phonons, magnetic and/or electrical fields, for example. The signal transmitters of the evaluation input and output regions serve, for example, to detect and relay the transmission of the memory region with the optically active material to an analysis unit for transmission or also to relay it only in order to serve, for example, as a control signal or evaluation input signal for a further component. The signal at the evaluation output region is also intended to be able to control at least one further component. A plurality of components or an arrangement comprising a plurality of components can thus be integrated, for example, in parallel and/or in series, into a circuit, in particular an optical circuit. In terms of their geometric arrangement, these component arrangements can be one-dimensional, two-dimensional and/or three-dimensional and can then be involved in computing or memory operations. Ultimately, arrangements of a plurality of elements or components, in particular at least two components, can be integrated into optical processors, arithmetic logic units, optical switches or optical memories, which can be operated only by photons, for example.

In principle, the components could also be formed into arrays or switching matrices. A component could be a part of an arrangement and/or a part of a computing unit and/or a part of processors.

The evaluation input region, the evaluation output region and the control arrangement can also change their function on the optically active material within the component. As a result, for example, the component can also be used in various directions.

Signal transmitters of the control arrangement, as well as of the evaluation input region or evaluation output region, in the form of optical conductors, can irradiate with an angle of incidence, or beam angle in the case of the evaluation output region, of between ≥90° to 180° onto the surface of the optically active material in the memory region or exit from the surface of the optically active material in the case of the evaluation output region. In the context of the present disclosure, an angle of incidence or beam angle of 90° should be understood to mean the signal entering or exiting perpendicularly to the surface of the optically active material. Signal transmitters having an angle of incidence or beam angle>90°, relative to the 90° angle of incidence/beam angle defined perpendicularly to the surface, therefore impinge obliquely on the surface of the optically active material or exit obliquely from the surface. For example, the degree of reflection, but also the depth of penetration in the material, and thus the transmittance, can be controlled by the set angle.

The transmission spectrum of the respective optically active material plays an essential role in the selection of the suitable optically active materials and the selection of the suitable signal transmitters in the evaluation input region for changing the optical properties of the optically active material. Optical conductors in the form of glass fibers have, for example, a high transmission at wavelengths of, for example, 1550 nm, 1300 nm and 850 nm. In the selection of glass fibers as signal transmitters and the selection of a suitable optically active material, this material should advantageously have a high transmission (in one of the states it can assume) at these mentioned wavelengths in order to obtain the highest possible transmission signal. The higher the transmission signal, the more clearly and accurately it is possible to detect a change in the transmission signal.

The component can advantageously comprise at least two different optically active materials in the memory region. Furthermore, it is also possible for the memory region to also comprise four or more different materials. Different optically active materials absorb different wavelengths, and these wavelengths then bring about different changes in the material properties. This leads to different and or discrete transmittances. They will also transmit different wavelengths of the evaluation input signal differently. A plurality of different materials is advantageously used for integrated optical circuits. These materials can be linked to one another logically, represent different functions and lead to the desired algorithms. The different materials should differ in the effect of the input power on the optical properties which change the transmittance (e.g., different absorption coefficients, thickness and/or phase-change point). For example, phase-change materials (=PCM) can be used which, with a different input power of the control signal of the control arrangement, switch at different rates.

The different optically active materials can, for example, advantageously be arranged in a layer structure comprising stacked layers arranged on top of one another or next to one another. These stacked layers are preferably not physically separated from one another. As a result, a plurality of different optical materials which have differently changeable specific optical properties and with which a multiplicity of information (bits) can then also be processed and/or stored can be arranged in a component. The layer thickness of the optically active material must be set in such a way that the respective transmission can still be measured optically and a change in the transmission by the influence of the means of the control arrangement also remains optically evaluable. The transmission is also dependent on the material properties of the optically active material, such as absorption coefficients of the material, and on geometric parameters, such as the thickness of the material.

The respective layers of the different optical materials in the layer structure in the memory region can be arranged perpendicularly to the beam direction of the control signal and/or in parallel to the beam direction of the control signal. A further signal control of the component can be achieved with this advantageous arrangement. Which region and up to which layer is switched is determined dependent on whether the layers are switching earlier or later. This advantageous arrangement of the different materials allows the component to fulfill its versatile functionality and its logical function.

Reflective means can be arranged behind the memory region with the optically active material which is opposite the beam direction of the optical conductor of the control arrangement. Reflective materials can also be arranged where the evaluation input region, the evaluation output region and the control arrangement do not touch the optically active material. The reflective means may be, for example, a metallic mirror, mirrors comprising dielectric multi-layers, or also an optically active material having metallic properties. The signal of the control arrangement to the memory region may suffer fewer losses due to these reflective means. Anti-reflection means may also be arranged where the evaluation input region and the control arrangement touch the memory region. They can serve for more efficient signal coupling into the optically active material. The anti-reflective means may be, for example, oxides and nitrides of silicon. In an advantageous embodiment of the component, the control arrangement and/or the evaluation input region may also have at least two signal transmitters. It is also possible for four signal transmitters, up to as many signal transmitters as technically possible, to be used. As a result, a signal can be transmitted from the control arrangement to the memory region at individual locations of the memory region, and a stepwise or serial signal irradiation to the memory region can also be carried out. The number of signal transmitters depends on the desired function/functionality of the component and the feasibility.

The evaluation input region may comprise signal transmitters for relaying an optical output signal, which may, for example, be optical fiber cables, wave guides, photon radiators, laser emitters.

However, signal transmitters can also be dispensed with in the near-field range.

The evaluation output region may comprise signal transmitters for detecting the optical output signal. Photodetectors, photodiodes, polarimeters, transmission meters or even spectrometers can be used as analysis unit in the evaluation output region for detecting the changed optical properties. The measured optical signals can then be converted into an electrical signal, for example, via an optoelectrical interface. Further components or elements with optically active materials can also receive and modulate the signal. In the near-field range, however, a signal transmitter can also be dispensed with here.

FIGS. 1 to 8*e* show exemplary embodiments of the component in a sectional view.

All FIGS. 1 to 8*e* have in common that the component comprises a control arrangement 1 having at least one control signal 1*a* for changing the optical properties of the optically active material 4*a* and preferably, but not necessarily, at least one signal transmitter 1*b*, an evaluation input region 2, which adjoins the control arrangement 1, also referred to synonymously hereinafter as control unit 1, and which has at least one evaluation input signal 2*a* and preferably, but not necessarily, at least one signal transmitter 2*b*, and an evaluation output region 3 comprising an evaluation output signal 3*a* and preferably, but not necessarily, a signal transmitter 3*b*, wherein the memory region 4 with the optically active material 4*a* is arranged between the evaluation input region 2 and evaluation output region 3 and adjoins the control unit 1 with the the control signal 1*a*.

The basic operating principle of the component is to be described with the aid of FIG. 1 as follows. In order to determine the initial optical properties or the basic signal of the component, in the evaluation input region 2, an evaluation input signal 2*a* in the form of a light signal (laser beam, laser pulse, a light-emitting diode, a photon source also of a single photon) is initially preferably, but not necessarily, transmitted by a signal transmitter 2*b* to the optically active material 4*a* in the memory region 4 and in the evaluation output region 3, the evaluation output signal 3*a* is detected preferably, but not necessarily, via a signal transmitter 3*b* and relayed to an analysis unit, such as a spectrometer, a photodiode or a photodetector or to a further photonic unit and the initial optical property is determined.

The transmittance of the component in the initial state can preferably be determined by these method steps. This transmittance can then be converted into an electrical signal, for example, via an interface.

In order to change the optical property of the optically active material 4*a* in the memory region 4 and thus to input information into the memory region 4, a control signal 1*a*, in the form of one of the previously described exemplary external influences, is preferably, but not necessarily, transmitted via a signal transmitter 1*b* to the memory region 4 with the optically active material 4*a*, resulting in a change in the optical properties of the optically active material 4*a* already described in more detail above.

In order to evaluate this changed optical property or the change, for example, in the transmittance, an evaluation input signal 2*a* is now again preferably, but not necessarily, transmitted by the evaluation input region 2 by means of the signal transmitter 2*b* to the optically active material in memory region 4 and in the evaluation output region 3, the evaluation output signal 3*a* is preferably, but not necessarily, detected via a signal transmitter 3*b* and relayed to an analysis unit, such as photodetectors (photodiodes), a polarimeter, transmission meter or even spectrometer. The transmittance of the component, which is changed in comparison to the basic signal in the form of the initial optical property, is then determined. This transmittance can then, for example, be converted again into an electrical signal via an interface.

The optically active material 4*a* in the memory region 4 can thus, for example, be in state 0 (basic signal) and 1 (optically changed basic signal) and thus contain bits of the information. In the present exemplary embodiment, the information content is contained in the form of photons. FIG. 2*a* shows an exemplary embodiment of the component in a sectional view, in which the optically active material 4*a* in the memory region 4 consists of phase-change material (PCM). For example, in FIG. 2*a*, the PCM is in state "1" (PCM "1"). The signal associated with state "1," in the form of the measured basic signal in the form of the (initial) transmittance, is initially determined, as described above for FIG. 1.

FIG. 2*b* shows, as a continuation of FIG. 2*a*, an exemplary embodiment of the component with a phase-change material (PCM) as an optically active material 4*a* in the memory region 4, wherein the PCM from FIG. 2*a* is now in state "2" (PCM "2"). Here, for example, an optical control signal 1*a*, in the form of irradiation of a certain infrared wavelength, is preferably, but not necessarily, passed via the signal transmitter 1*b* into the memory region 4, resulting in a change in the optical property of the PCM material. In this exemplary embodiment, the optical control signal 1*a* does not lead to a complete change in the amorphous state of the PCM material to the crystalline state or vice versa but only to a partial change in the state of the PCM material. The signal, which can be assigned to the PCM material in state "2," can be determined as already described above for FIG. 2*a*.

FIG. 2*c* shows, as a continuation of FIGS. 2*a* and 2*b*, an exemplary embodiment of the component with a phase-change material (PCM) as an optically active material 4*a* in the memory region 4, wherein the PCM from FIG. 2*a* is now in state "3" (PCM "3"). Here, for example, an optical control signal 1*a*, in the form of irradiation of a certain infrared wavelength, was passed into the memory region 4, preferably, but not necessarily, again via the signal transmitter 1b of the control unit 1, resulting in a further partial change to the optical property of the PCM material. The signal, which can be assigned to the PCM material in state "3," can be determined as already described above for FIG. 2a. The change in the optically active material 4a can be controlled here, for example, by a different power input of the wavelength, a different pulse duration or also a different penetration depth.

In this case, the embodiment of a component comprising phase-change material as an optically active material 4a is not set in the initial state to a specific phase of this material but can instead be selected arbitrarily.

On the one hand, phase-change materials can be used in which the control signal 1a brings about an amorphization of the crystalline state by means of a short pulse with high energy, or a long pulse with low energy brings about a crystallization of the material. However, it is also possible, for example, for a phase-change material to be used which behaves exactly in the opposite way.

For example, it would be possible that in one case, a short pulse with high energy in one material results in an amorphization and increase in transparency (high transmission close to 100%) and in another case, a short pulse with high energy in another material results in a crystallization and thus a decrease in transparency.

FIG. 3 shows an exemplary embodiment of the component in which the optically active material 4a in the memory region 4 is changed by the optical influence of photons of a wavelength $\lambda 1$, triggered by the control signal 1a of the control unit 1, and the evaluation of the signal is evaluated with the same wavelength $\lambda 1$.

FIG. 4 shows an exemplary embodiment of the component in which the optically active material in the memory region 4 is changed by the optical external influence of the control signal 1a in the form of photons of a wavelength $\lambda 2$, and the evaluation of the signal is evaluated with a different wavelength $\lambda 1$. In a more complex arrangement of a plurality of, at least two, components, it is also possible to use a plurality of different wavelengths: $\lambda 2$, wherein the evaluation of the signals can then also take place with a plurality of different wavelengths $\lambda 1$.

Figure 5A:
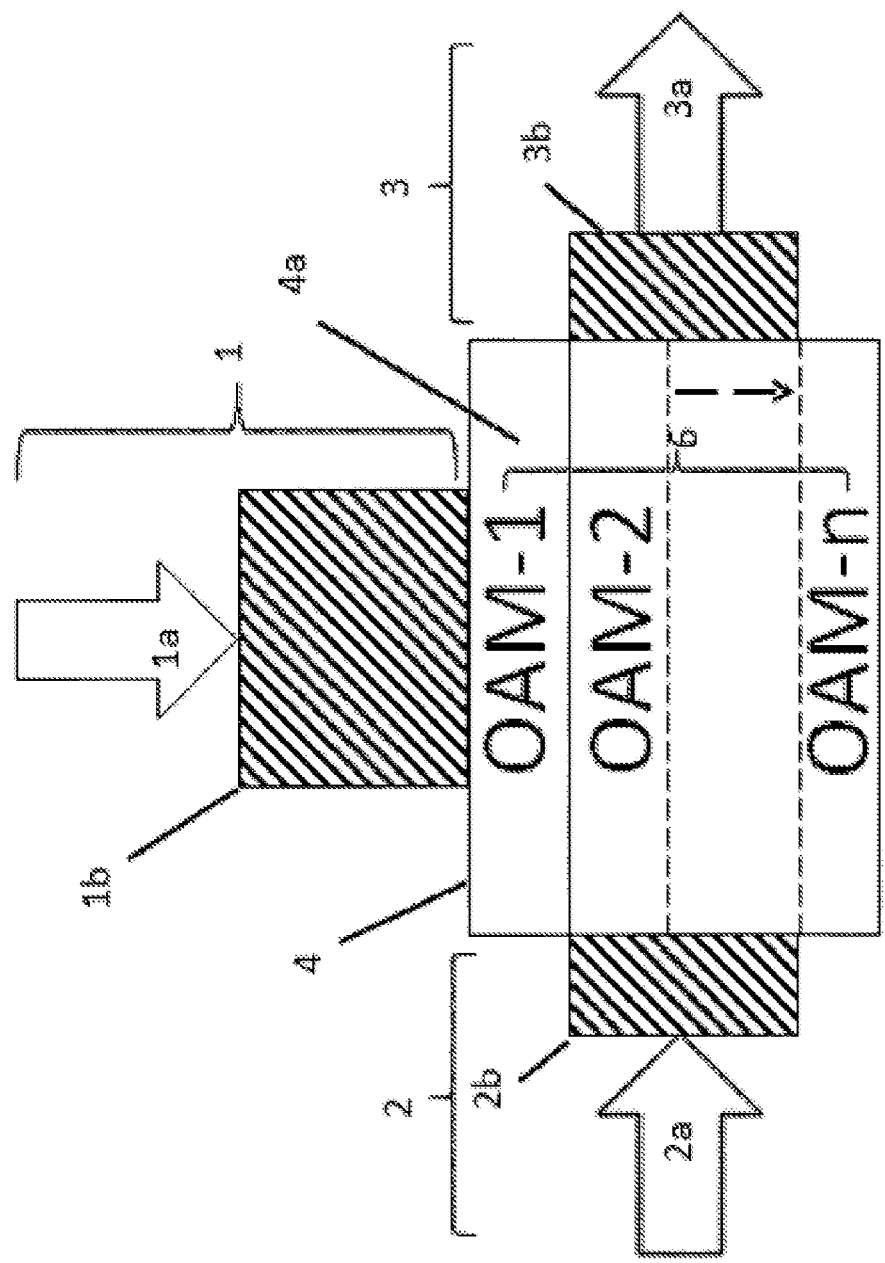
FIG. 5a illustrates an exemplary embodiment of a component with a layer arrangement/layer structure of different optical materials oriented perpendicularly to the beam direction of the control arrangement.

FIG. 5a shows an exemplary embodiment of the component in which the memory region 4 comprises a plurality of 1 to n different optically active materials OAM-1 to OAM-n arranged in layers arranged on top of one another to form a layer structure 6, wherein the individual layers are each oriented perpendicularly to the beam direction of the control signal 1a of the control arrangement 1.

FIG. 5b shows an exemplary embodiment of the component in which the memory region 4 comprises a plurality of 1 to n different optically active materials OAM-1 to OAM-n arranged in layers arranged next to one another in a layer structure 6, wherein the individual layers are each oriented in parallel to the beam direction of the control signal 1a of the control arrangement 1.

FIG. 6 shows an exemplary embodiment of the component in which behind the memory region 4 with the optically active material 4a, a layer 5 is arranged, which the control signal 1a, which passed in by the control unit 1, preferably, but not necessarily, with the aid of the signal transmitter 1b through the optically active material 4a of the memory region 4 and exits therefrom again, is reflected by the layer 5 and can cause signal amplification. Said layer 5 can reflect back the external influence introduced by the control signal 1a into the memory region 4 with the optically active material 4a in the form of, for example, photons, phonons or other previously mentioned external influences so that the control signal 1a preferably leads without losses to the change in the optical properties, e.g., to the phase change, in the optically active material 4a. Metals, such as Ag, Au, Al, Cu or mirrors made of dielectric multi-layers (e.g., Bragg mirrors), which are appropriate to the signal wavelength, can be used as reflective layer 5. For example, the reflective surface may be placed anywhere where no signal transmitters contact the optically active material 4a.

FIG. 7a shows an exemplary embodiment of the component with two control signals 1a and two signal transmitters 1b which can cause a stepwise or discrete change in the optical properties of the optically active material 4a in the memory region 4. Phase-change materials, which can assume intermediate states between the crystalline and amorphous states, can be mentioned as an example of a stepwise or discrete change in the optical properties of an optically active material.

Compared with the embodiment in FIG. 7a, the memory region 4 according to FIG. 7b can comprise, for example, two different optically active materials, OAM-1 and OAM-2. In the present embodiment, these are two different PCMs, PCM1 and PCM2. These can react differently to the control signals 1a emitted by the control unit 1 so that a different, independent switching of the individual materials becomes possible. By means of this embodiment, a logical combination of information can be stored and interconnected, for example.

FIG. 8a shows an exemplary embodiment of the component in which the evaluation signal unit 2 comprises two evaluation input signals 2a with two signal transmitters 2b so that the memory region 4 can be impinged upon by two different evaluation input signals 2a so that the signal in the memory region 4 can be evaluated with different signals. By means of this embodiment, a logical combination of information can be stored and interconnected, for example.

Compared to FIG. 8a, FIG. 8b shows, in addition to the two evaluation input signals 2a with two signal transmitters 2b, two control signals 1a with corresponding signal transmitters 1b so that the optically active material 4a can be evaluated not only with two different evaluation input signals 2a but also with two different control signals 1a. By means of this embodiment, a logical combination of information can be stored and interconnected, for example FIG. 8c shows a further possible embodiment of the element or component, in which, in comparison to the embodiment shown in FIG. 8b, the optically active material 4a in the memory region 4 is also additionally composed of two different optically active materials, OAM-1 and OAM-2. These two different materials are arranged in a layer arrangement or layer structure 6, wherein the two respective layers are oriented perpendicularly to the beam direction of the control signals 1a of the control unit 1.

FIG. 8d shows an embodiment of the element or component, which is substantially similar to FIG. 8c, wherein, in contrast to the embodiment according to FIG. 8c, the two respective layers of the different optically active materials 4a comprising the two different optically active materials OAM-1 and OAM-2 in the memory region 4 are oriented in parallel to the beam direction of the control signals 1a of the control unit 1.

In comparison to the embodiments according to FIGS. 8c and 8d, FIG. 8e shows a further variant of the element or component, in which, in contrast to the embodiments in FIGS. 8c and 8d, the memory region 4 comprises different optically active materials 4a, OAM-1, OAM-2, OAM-3 and OAM-4. These are arranged in a layer arrangement or layer structure 6 in such a way that two different materials arranged on top of one another, OAM-1 and OAM-3 as well as OAM-2 and OAM-4, are in each case oriented perpendicularly to the beam direction of the control signals 1a of the control unit 1.

Although the previously illustrated exemplary embodiments predominantly describe the change in the optically active material 4a in the form of external optical influence, the optical properties of the optically active material 4a can, of course, depending on the optically active material 4a selected, also be changed with all other possibilities of the external influence mentioned in the text above, and the component can also be used for processing and/or storing information with the aid of said external influences.

While subject matter of the present disclosure has been illustrated and described in detail in the drawings and foregoing description, such illustration and description are to be considered illustrative or exemplary and not restrictive. It will be understood that changes and modifications may be made by those of ordinary skill within the scope of the following claims. In particular, the invention defined by the following claims may cover further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LITERATURE

1. Wuttig M, Yamada N. Phase-change materials for rewritable data storage. Nat. Mater. [Internet]. 2007; 6:824-32. Available from: http://www.nature.com/doifinder/10.1038/nmat2009
2. Vieweg N, Wilk R, Shakfa M K, Kloc J M, Scheller M, Jansen C, et al. Terahertz Investigation of Liquid Crystals from the CB Family. 2010 IEEE Photonics Soc. Winter Top. Meet. Ser. [Internet]. IEEE; 2010. p. 32-3. Available from:
http://ieeexplore.ieee.org/document/5421977/3.
3. Rey-de-Castro R, Wang D, Zheng X, Verevkin A, Sobolewski R, Mikulics M, et al. Subpicosecond Faraday effect in Cd1-xMnxTe and its application in magneto-optical sampling. Appl. Phys. Lett. [Internet] 2004; 85:3806-8. Available from: https://doi.Org/10.1063/1.1809280

LIST OF REFERENCE SIGNS

1 Control arrangement or control unit
1a Control signal for changing the optical properties of the optically active material 4a
1b Signal transmitter of control arrangement 1
2 Evaluation input region
2a Evaluation input signal
2b Signal transmitter of the evaluation input region
3 Evaluation output region
3a Evaluation output signal
3b Signal transmitter of the evaluation output region
4 Memory region
4a Optically active material
5 Reflective means
6 Layer arrangement or layer structure comprising optically active material

The invention claimed is:

1. A component comprising:
a memory region containing optically active material,
a control arrangement configured to provide at least one control signal configured to change optical properties of the optically active material, and
a detector configured to detect a change in the optical properties of the optically active material, comprising an evaluation input region configured to receive at least one evaluation input signal and an evaluation output region configured to provide an evaluation output signal,
wherein the memory region is arranged between the evaluation input region and the evaluation output region and the control arrangement adjoins the memory region.

2. The component according to claim 1, comprising wherein the change in the optical properties of the optically active material is optically readable as a change in a transmittance of the optically active material.

3. The component according to claim 1, wherein the change in the optical properties of the optically active material is reversible.

4. The component according to claim 1, wherein the optically active material comprises material which is photochromic, electrochromic, magnetochromic or piezochromic.

5. The component according to claim 1, wherein the optically active material is present as a solid, gas and/or liquid.

6. The component according to claim 1, wherein the optical properties of the optically active material can be changed by external influence in the form of thermal influence, optical influence in the form of phonons or photons, by the influence of an input power in the form of optical, electrical and/or magnetic fields or by mechanical influence.

7. The component according to claim 1, wherein the optical properties of the optically active material can be changed by optical influence, the optically active material containing at least one component from the group consisting of azo compounds, stilbines, azastilbines, spiropyrans, spirooxazines, triarylmethanes, polymethines, pyrroles, hydrazines, sydnones, disulfides, nitroso dimers, quinones, chalcogenide-based phase-change compounds, in particular in the GeTe—$Sb_2Te_3$ material system, Te—Ge—Sb—S material system or Ag—In—Sb—Te material system as well as phase-change materials, as well as oxides of titanium or tungsten, sulfides or alkaline earth metals, and halides of silver and zinc.

8. The component according to claim 1, wherein the optical properties of the optically active material can be changed by electrical influence, the optically active material containing at least one component from the group consisting of oxides of tungsten, iridium, molybdenum, nickel, vanadium, cerium, chromium, cobalt, copper, iron, manganese, niobium, palladium, praseodymium, rhodium, ruthenium, conjugated conductive polymers, the metal polymers, in particular materials with two or more redox states and with unique electronic absorption spectra, the chalcogenide-based phase-change compounds, the materials which exhibit the electro-optical Kerr effect and/or which change the optical properties by the influence of an electric field, the materials used in nonlinear optics and/or which are birefringent, in particular DAST crystals, the liquid crystals, the electro-optical crystal, such as in particular $LiNbO_3$ and $LiTaO_3$, Ge—Sb—Mn—Sn, and Ge(In, Ag, Sn).

9. The component according to claim 1, wherein the optical properties of the optically active material can preferably be changed by magnetic or magneto-optical influence, the optically active material containing at least one component from the group consisting of colloidally dissolved magnetic nanoparticles, such as $Fe_3O_4$, or the materials exhibiting the magneto-optical Kerr effect (MOKE), such as dilute magnetic semiconductors, in particular CdMnTe.

10. The component according to claim 1, wherein the optical properties of the optically active material can preferably be changed by mechanical influence, the optically active material containing at least one component from the group consisting of mechanochromic, in particular piezochromic, materials, in particular polyvinyl chlorides and fluorites.

11. The component according to claim 1, wherein the control signal, the evaluation input signal and/or the evaluation output signal acts directly on the memory region and/or is recorded directly from the memory region.

12. The component according to claim 1, wherein the control arrangement comprises at least one signal transmitter.

13. The component according to claim 1, wherein the evaluation input region comprises at least one signal transmitter.

14. The component according to claim 1, wherein the control arrangement and/or the evaluation input region each comprise at least two signal transmitters.

15. The component according to claim 1, wherein the evaluation output region comprises at least one signal transmitter.

16. The component according to claim 1, wherein a signal transmitter of the control arrangement, of the evaluation input region and/or of the evaluation output region comprises optical conductors.

17. The component according to claim 1, wherein at least one signal transmitter of the control arrangement impinges on the optically active material of the memory region with an angle of incidence between ≥90° to 180°.

18. The component according to claim 1, wherein the evaluation output region, comprises photodetectors, photodiodes, polarimeters, transmission meters and/or spectrometers as an analysis unit for detecting the changed optical properties.

19. The component according to claim 1, further comprising an interface configured to convert the detected signal into an electrical signal in the evaluation output region.

20. The component according to claim 1, wherein the signal of the evaluation output region is configured to control at least one further component.

21. The component according to claim 1, wherein the memory region comprises at least two different optically active materials.

22. The component according to claim 21, wherein the at least two differently optically active materials are arranged in a layer structure.

23. The component according to claim 22, wherein the layer structure comprises a plurality of layers of different optically active materials which are arranged on top of one another or next to one another.

24. The component according to claim 22, wherein the respective layers of the layer structure of the optically active material are arranged perpendicularly to a beam direction of the control signal or are arranged in parallel to a beam direction of the control signal.

25. The component according to claim 1, wherein a reflector is arranged behind the memory region with the optically active material and/or behind the evaluation input region and/or the evaluation output region.

26. A method for processing and/or storing information, the method comprising:
 processing, using the component according to claim 1, the information; and
 storing, using the component according to claim 1, the information.

* * * * *